United States Patent [19]

Riding et al.

[11] Patent Number: 5,057,358

[45] Date of Patent: Oct. 15, 1991

[54] UV-CURABLE EPOXY SILICONES

[75] Inventors: Karen D. Riding, Castleton; David E. Farley, Clifton Park, both of N.Y.

[73] Assignee: General Electric Company, Waterford, N.Y.

[21] Appl. No.: 498,300

[22] Filed: Mar. 23, 1990

[51] Int. Cl.$^5$ .................. B32B 3/00; B32B 15/04; C08G 77/06; C08G 77/04
[52] U.S. Cl. .................. 428/209; 428/450; 522/31; 522/170; 528/15; 528/19; 528/33
[58] Field of Search .................. 522/31, 99, 170; 528/13, 19, 43, 25, 33; 549/215; 428/209, 450

[56] References Cited

U.S. PATENT DOCUMENTS

| 4,421,904 | 12/1983 | Eckberg et al. | 528/19 |
| 4,822,687 | 4/1989 | Kessel et al. | 528/15 |

Primary Examiner—Marion E. McCamish
Assistant Examiner—Susan Berman
Attorney, Agent, or Firm—Mary A. Montibello

[57] ABSTRACT

UV-curable compositions are provided comprising blends of epoxy-functional silicones of various chain lengths. These compositions have improved physical properties as compared to otherwise weak and brittle UV-cured epoxy-functional silicones without adding fillers and without sacrificing fast, efficient UV cure speed. Such compositions are useful as conformal coatings, optical fiber coatings, and electrical encapsulation.

14 Claims, No Drawings

UV-CURABLE EPOXY SILICONES

BACKGROUND OF THE INVENTION

This invention relates to epoxy-functional organopolysiloxanes. More particularly, this invention relates to blends of epoxy-functional organopolysiloxanes and their use as conformal coatings, optical fiber coatings, and electrical encapsulation.

Silicone compositions have become widely accepted as protective coatings for electronic components mounted on circuit boards. The moisture resistance, thermal stability and resistivity of silicones make them ideal for this purpose. The cure chemistry of radiation curable silicones is most often free-radical in nature, requiring a high flux of radicals generated by UV light radiation of photoinitiators.

A drawback to free-radical crosslinking processes is that such processes are subject to inhibition by atmospheric oxygen. The "oxygen effect" is particularly troublesome in oxygen-permeable silicone systems. Prompt cure response, therefore, is dependent on either efficient nitrogen blanketing to forestall oxygen cure inhibition or the use of amine-benzophenone-type synergist catalyst systems to overcome the oxygen effect.

Production ultraviolet facilities are not easily nor economically inerted, particularly if wide web converting or high speed processing is practiced. Furthermore, amine-benzophenone-type synergist catalyst systems, which are useful for overcoming oxygen inhibition in organic acrylate UV cure resins, are usually incompatible with dimethyl silicone polymers. Fast non-inerted UV cure is achievable by combining mercapto- and acrylated-silicones with certain photosensitizers, but such systems are meta-stable and subject to shelf-life and pot-life limitations.

Currently, UV-curable silicone coatings useful for conformal coatings, optical fiber coatings, and electrical encapsulation contain silicon-bonded mercapto-olefin or acrylate radicals. Reference is made, for example, to U.S. Pat. Nos. 4,558,082; 4,585,669; 4,587,137; 4,496,210; and 4,780,486.

However, the use of mercapto-olefins or acrylates has several drawbacks. For example, acrylates are toxic and both acrylate monomers and mercaptans give off highly offensive odors which can persist in the cured products, and because of precautionary/safety measures entailed by their use, they are not readily adapted to industrial applications.

It is desirable therefore to provide conformal coatings and coatings for optical fibers and electrical encapsulation which are made from UV-curable silicone compositions which do not contain mercapto-olefin or acrylate functionality and which do not cure in a free-radical based crosslinking process.

Cationic (non-radical) UV cure processes are not affected by oxygen and are therefore well suited for high speed silicone coating and curing processes. Cationic UV cure of silicones has been found to be most practical with epoxy-functional silicones.

It would be desirable, therefore, to provide conformal coatings and coatings for optical fibers and electrical encapsulation which are made from UV-curable epoxy-functional silicone compositions.

Epoxysilicone compositions containing epoxy-functionalized silicone polymers and silicone miscible iodonium photocatalysts are presently used as release coatings.

High speed solventless silicone release processing requirements dictate that UV-curable epoxysilicone release compositions be limited to unfilled, low molecular weight, highly organofunctionalized polymers whose cured films are therefore brittle, easily abraded, weak substances unsuited for other coating applications.

Conformal coatings are desired to be tough and have high tensile strength and high percents of elongation.

Accordingly, it was desirable to provide UV-curable epoxy-functional silicone coatings with improved film properties for use as conformal coatings and coatings for optical fibers and electrical encapsulation.

It was further desirable to provide epoxy-functional silicone coatings with improved film properties without using fillers. Fillers tend to block UV light which consequently slows down cure dramatically. Furthermore, it is difficult to incorporate fillers into low viscosity matrices such as epoxy-functional silicone polymers.

SUMMARY OF THE INVENTION

Accordingly, it is an object of the present invention to provide UV-curable epoxy-functional silicone coatings which combine non-oxygen inhibited fast UV cure with improved film properties for use as conformal coatings and coatings for optical fibers and electrical encapsulation.

It is further object of the present invention to provide UV-curable epoxy-functional silicone coatings with improved film properties without using fillers.

These objects are achieved in the present invention.

The present invention provides an ultraviolet radiationcurable composition, comprising:

(A) a blend of epoxy-functional dialkylpolysiloxanes comprising by weight:
(a) about 5 to about 25 weight % of an epoxy-functional dialkylpolysiloxane having the general formula

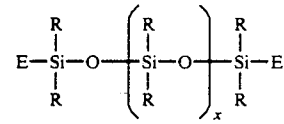

wherein x is a value in the range of about 200 to about 550;

(b) about 10 to about 30 weight % of an epoxy-functional dialkylpolysiloxane having the general formula:

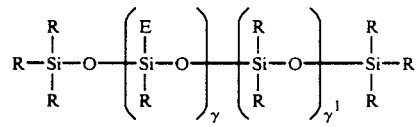

or an epoxy-functional dialkylpolysiloxane having the general formula

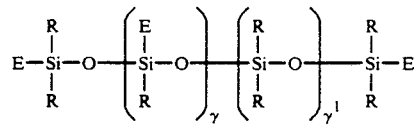

or a mixture of the foregoing, wherein y is a value in the range of about 3 to about 5, and $y^1$ is a value in the range of about 20 to about 100; and (c) about 45 to about 85 weight % of an epoxy-functional dialkylpolysiloxane having the general formula

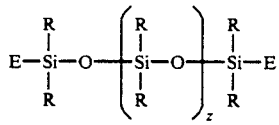

wherein z is a value in the range of 75 to about 150; wherein E represents an epoxy-functional organic radical having from 2 to 20 carbon atoms and R is individually a lower alkyl radical having 1 to 8 carbon atoms, and (B) a catalytic amount of an onium salt photoinitiator or a combination of onium salt photoinitiators.

The composition provided by this invention has a tensile strength of at least about 40 pounds per square inch (psi) and an elongation of about 60%.

In other embodiments, the present invention provides a method for preparing the composition described above as well as articles coated with the composition.

DETAILED DESCRIPTION OF THE INVENTION

For purposes of simplicity, the epoxy-functional silicones of parts (a), (b), and (c) in component A of the composition of this invention, will be referred to hereinafter as polymer (a), polymer (b), and polymer (c), respectively.

In general, conformal coatings should have a tensile strength of at least about 40 pounds per square inch (psi) and elongation of at least about 60%.

It was found that tensile strength and hardness generally increased as increased amounts of polymer (b) and decreased amounts of polymer (a) were used. On the other hand, % elongation was found to generally increase as increased amounts of polymer (a) and decreased amounts of polymer (b) were used. It was desirable to obtain a blend which would provide the optimal balance of tensile strength and elongation values.

It was found that a blend containing about 5 to about 25 weight % of polymer (a) about 10 to about 30 weight % of polymer (b), and about 45 to about 85 weight % of polymer (c), provided the tensile strength and elongation values mentioned above. In the preferred embodiment of this invention, component (A) contains about 5 to about 25 weight % of polymer a, about 15 to about 25 weight % of polymer (b), and about 55 to about 80 weight % of polymer (c), which provides a tensile strength in the range of about 55 to about 90 psi and an elongation of about 80 to about 125 %. In the preferred embodiment of this invention, component (A) contains about 10 to about 20 weight % of polymer (a), about 15 to about 20 weight % of polymer (b), and about 60 to about 80 weight % of polymer (c), which will provide a tensile strength of about 55 to about 75 psi and an elongation of about 100 to about 125 weight %.

In formulas (I)–(IV), R is a lower alkyl radical having 1 to about 8 carbon atoms, preferably methyl. E is an epoxy-functional organic radical having from 2 to 20 carbon atoms. Preferably, E is derived from 4-vinylcyclohexeneoxide and has the formula:

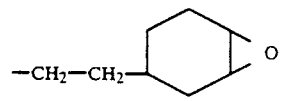

In formula (I), x is about 200 to about 550, preferably about 250 to about 510, and most preferably about 350 to about 510. In formula (II), y is about 3 to about 5, preferably about 3 to about 4, and most preferably about 3; and $y^1$ is about 20 to about 100, preferably about 20 to about 50, and most preferably about 20 to about 30, and z is about 80 to about 120, preferably about 90 to about 110.

Polymers (a) and (c) are prepared in a two-step process wherein (1) an ethylenically unsaturated epoxy monomer is reacted in the presence of a platinum catalyst with a sym-tetraalkyldisiloxane to form a sym-1,3-epoxy-tetraalkyldisiloxane which is then (2) reacted with an octaalkylcyclotetrasiloxane in the presence of a tetraalkylammonium hydroxide to form a linear epoxy-stopped dialkylsiloxane having the general formulas (I) and (IV) above.

The desired number of repeating dialkyl siloxane units, i.e; x, in polymers (a) and (c) is obtained by using the proper molar ratio (n) of octaalkylcyclotetrasiloxane to epoxy-functional siloxane produced in step (1) of the process described above. In general, 1 mole of octaalkylcyclotetrasiloxane is required for every 4 units of dialkyl siloxane, i.e; x=4. Thus, for example, in the preparation of polymer (a) having an x value of 400, 100 moles of octaalkylcyclotetrasiloxane are used per mole of the epoxy-functional siloxane produced in step (1). If x=100 is desired, 25 moles of octaalkylcyclotetrasiloxane are used per mole of the epoxy-functional siloxane produced in step (1).

Polymer (c) is also prepared in a two-step process. In step (1), a trialkylchainstoppedpolydialkyl-alkyl hydrogen siloxane copolymer is reacted with a dialkylvinyl-chain-stopped linear polydialkylsiloxane in the presence of a platinum catalyst. In step (2), an ethylenically unsaturated epoxy monomer is reacted with the mixture prepared in step (1) to form polymer (c).

Suitable epoxy compounds for use in the processes described above include olefinic epoxy monomers such as limoneneoxide, 4-vinylcyclohexeneoxide, allylglycidylether, 7-epoxy-1-octene, vinylcyclohexenedioxide, bis(2,3-epoxycyclopentyl)ether, 3,4-epoxycyclohexylmethyl-3,4-epoxycyclohexanecarboxylate, cresylglycidyl ether, butanedioldiglycidyl ether and the like. Because their cationic cure response is much faster than that of their glycidyl ether analogs, cycloaliphatic epoxides are preferred for use in the present invention. The preferred cycloaliphatic epoxide is 4-vinylcyclohexeneoxide.

The catalyst used in step (1) of the process above is a platinum metal catalyst effective for adding hydrogen to the double bond of the vinyl group. Ordinarily, approximately 5 parts platinum metal per million parts of siloxane will be effective to promote this hydrosilation reaction. Examples are those exemplified in U.S. Pat. Nos. 3,220,972; 3,814,730; 3,775,452; and 3,715,334, each of which is herein incorporated by reference. Particularly useful are those platinum catalysts derived from chloroplatinic acid which has been treated with tetramethyldivinyldisiloxane, as described in U.S. Pat. No. 3,814,730 to Karstedt (hereinafter referred to as the "Karstedt catalyst."), which is incorporated by reference.

The amount of catalyst present in the composition of this invention is not critical, so long as proper polymerization is effected. As with any catalyst, it is preferable to use the smallest effective amount possible; for the purposes herein, catalyst levels of from about 0.014%–0.04% by weight have been found suitable.

Component B of the composition of this invention is an onium salt photoinitiator. Suitable photoinitiators are the onium salts having the formulae:

$R_2I^+MX_n^-$
$R_3S^+MX_n^-$
$R_3Se^+MX_n^-$
$R_4P^+MX_n^-$
$R_4N^+MX_n^-$ where radicals represented by R can be the same or different organic radicals from 1 to 30 carbon atoms, including aromatic carbocyclic radicals of from 6 to 20 carbon atoms which can be substituted with from 1 to 4 monovalent radicals selected from $C_{(1-8)}$ alkoxy, $C_{(1-8)}$ alkyl, nitro, chloro, bromo, cyano, carboxy, mercapto, and the like, and also including aromatic heterocyclic radicals including, e.g; pyridyl, thiophenyl, pyranyl, and the like; and $MX_n^-$ is a non-basic, non-nucleophilic anion, such as $BF_4^-$, $PF_6^-$, $AsF_6^-$, $SbF_6^-$, $SbCl_6^-$, $HSO_4^-$, $ClO_4^-$, and the like.

The preferred onium salts for use herein are the diaryliodonium salts and the bis-diaryl iodonium salts. Examples of suitable diaryliodonium salts are disclosed, for example, in U.S. Pat. No. 4,882,201, which is incorporated herein by reference. The most preferred of these salts is that having the formula

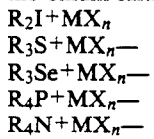

$SbF_6^-$

Examples of suitable bis-diaryl iodonium salts include, for example, bis(dodecyl phenyl)iodonium hexafluoroarsenate, and bis(dodecyl phenyl) iodonium hexafluoroantimonate, are preferred. Most preferred of the bis-diaryl iodonium salts is bis(dodecyl phenyl) iodonium hexafluoroantimonate.

The amount of catalyst present in the composition of this invention is not critical, so long as proper polymerization is effected. As with any catalyst, it is preferable to use the smallest effective amount possible; for the purposes herein, catalyst levels of from about 0.5%–3% by weight have been found suitable.

The curable compositions are prepared merely by combining the various ingredients. The articles of the present invention are prepared by applying such composition to a substrate such as a circuit board if the composition is to be used as a conformal coating, thereafter exposing the coated substrate to ultraviolet radiation sufficient to set the composition, and finally allowing curing to be completed by exposing the article to either room temperature or elevated temperature.

In order that those skilled in the art might be better able to practice the present invention, the following examples are given by way of illustration and not by way of limitation.

EXPERIMENTAL

In the examples below, a shorthand system commonly used in the silicone industry will be used to abbreviate silicone structures. Chainstop siloxy units are designated "M", while siloxane units comprising linear polysiloxanes are referred to as "D". Superscripts refer to organic groups other than methyl while subscripts refer to linear polysiloxane chains. Examples of these designations include the following:

$M = (CH_3)_3—SiO_{\frac{1}{2}}$

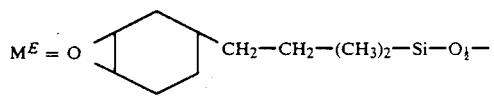

$M^H = (CH_3)_2HSiO_{\frac{1}{2}}—$
$D = —(CH_3)_2SiO—$

EXAMPLES 1–9

A series of epoxy-stopped dimethylsilicones were prepared having the formula

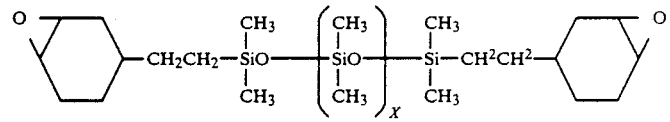

wherein the value of "x" varied in each example.

EXAMPLE 1

X = 0

6.05 moles of 4-vinylcyclohexeneoxide (VCHO, UCC) were dissolved in 1.5 kg hexane in a 5 liter flask. Sufficient Karstedt platinum catalyst was added to furnish 5 ppm Pt to the total reaction mixture. 3.0 moles of sym-tetramethyldisiloxane were then added dropwise, initiating an exothermic reaction which raised the temperature of the agitating mixture to 72° reflux. Following the addition, infrared spectra of the reaction mixture confirmed that no SiH remined. 1145 g (3 moles) of the sym-1,3-epoxy-tetramethyldisiloxane product were isolated as a mobile fluid, $N_D^{25}$-1.4726 vs. literature value of 1.4731.

EXAMPLE 2

X = 2

382 g (1 mole) of the sym-1,3-epoxy-tetramethyldisiloxane product formed in Example 1 above and 148 g (0.5 moles) of octamethylcyclotetrasiloxane and 0.7 g tetramethylammonium hydroxide (as a 20% solution in methanol) were agitated at 80° C. for 5 hours under nitrogen until equilibration was complete by GC analysis. The reaction was heated to 160° C. with a vigorous nitrogen sparge to decompose the catalyst and remove cyclic siloxane light ends. Devolatilization was considered complete when GC analysis revealed 0.25 weight % non-epoxy-functionalized silicones present.

EXAMPLE 3

X=4

The procedure of Example 2 was followed except that 296 g (1 mole) of octamethylcyclotetrasiloxane were used.

EXAMPLE 4

X=8

The procedure of Example 2 was followed except that 592 g (2 moles) of octamethylcyclotetrasiloxane were used.

EXAMPLE 5

X=14

The procedure of Example 2 was followed except that 1036 g (3.5 moles) of octamethylcyclotetrasiloxane were used.

EXAMPLE 6

X=18

The procedure of Example 2 was followed except that 1332 g (4.5 moles) of octamethylcyclotetrasiloxane were used.

EXAMPLE 7

X=50

The procedure of Example 2 was followed except that 3700 g (12.5 moles) of octamethylcyclotetrasiloxane were used.

EXAMPLE 8

X=100

The procedure of Example 2 was followed except that 7400 g (25 moles) of octamethylcyclotetrasiloxane were used.

EXAMPLE 9

X=400

The procedure of Example 2 was followed except that 29,600 g (100 moles) of octamethylcyclotetrasiloxane were used.

The important physical properties of the silicones formed in Examples 1-9 are shown in Table 1 below.

TABLE 1

| Example Numbers | Epoxystopped Dimethylsilicones $M^ED_XM^E$ | | | |
|---|---|---|---|---|
| | X | $N_D^{25}$ | E.E.W.* | Viscosity, cstk |
| 1 | 0 | 1.4726 | 191 | 70.0 |
| 2 | 2 | 1.4475 | 273 | 37.5 |
| 3 | 4 | 1.4420 | 339 | 30.0 |
| 4 | 8 | 1.4342 | 495 | 33.5 |
| 5 | 14 | 1.4325 | 717 | 45.0 |
| 6 | 18 | 1.4208 | 857 | 57.0 |
| 7 | 50 | 1.4105 | 2041 | 135.0 |
| 8 | 100 | 1.4074 | 3891 | 215.0 |
| 9 | 400 | 1.4040 | 14991 | 2400.0 |

Two sets of experiments were conducted with the $M^ED_XM^E$ compositions prepared in Examples 1-9.

UV Cure Efficiency

UV Cure efficiency was assessed by blending 0.5 wt. % photocatalyst I and II with the sample, manually coating 2 mil thick films onto polyethylene kraft paper (PEK) substrate, then determining minimum UV flux required to convert the film to a smear-, migration-, tack-free 2 mil thick coating either in the RPC UV Processor or with the Portacure device. UV flux was measured with an International Light Photometer equipped with an A309 Lightbur accessory. The 2 mil cure results are noted in Table 2.

TABLE 2

| | $M^ED_XM^E$, UV Flux for Cure, mJ/cm² | | |
|---|---|---|---|
| Example No. | X | 0.5% Catalyst I | 0.5% Catalyst II |
| 1 | 0 | 30 | 15 |
| 2 | 2 | 36 | 20 |
| 3 | 4 | 47 | 30 |
| 4 | 8 | 48 | 40 |
| 5 | 14 | 50 | 80* |
| 6 | 18 | 54 | 120* |
| 7 | 50 | 85* | ** |
| 8 | 100 | 830* | ** |
| 9 | 400 | Less than 5000* (tacky) | ** |

*Catalyst partially soluble (stable suspensions)
**Catalyst immiscible (rapid separation on standing)

Low molecular weight members of the series display very fast UV cure response, but as epoxy content decreases cure efficiency decreases due to diminished reactivity and reduced solubility of polar iodonium catalysts in nonpolar silicone media. These results conform to expectations and are similar to UV cure speed results for acrylate analogs.

UV-Cured Film Properties

Physical property profiles of cured $M^ED_XM^E$ films were then determined on thicker sections of the materials. 1.0 wt. % photocatalyst I was mixed with $M^ED_XM$ samples until uniform solutions or suspensions were obtained. 12.5 to 15.0 grams of catalyzed epoxysilicones were weighed into shallow 12 cm diameter circular weighing pans, then allowed to sit undisturbed while air bubbles dissipated and the fluid leveled. Assuming 1.0 g/cc density, slabs were cured which were 40 to 50 mils thick. Less than 5 J/cm² total UV flux was required for through-cure of the samples, which were extricated from their molds, then briefly exposed on their undersides to eliminate any uncured spots. Tensile bars were cut per ASD 412-83 and peak tensile strength and peak elongation measured on a Monsanto T-10 tensionmeter (1 inch gauge, 20 ipm pull). Imperfections and uneven thickness of the UV-cured sheets prevented their conforming to ASTM sample specifications, so these results do not meet ASTM standards. In addition, the low molecular weight members of the $M^ED_XM^E$ series cured to such brittle slabs that tensile determinations are presumed to be invalid.

TABLE 3

| | $M^ED_XM^E$, UV-Cured Film Properties | | |
|---|---|---|---|
| Example Number | x | Peak Tensile, psi | Peak Elongation, % |
| 1 | 0 | Too brittle for meaningful results | |
| 2 | 2 | Too brittle for meaningful results | |
| 3 | 4 | Too brittle for meaningful results | |
| 4 | 8 | Too brittle for meaningful results | |
| 5 | 14 | 30* | More than 2 |
| 6 | 18 | 25* | More than 5 |

TABLE 3-continued

| | $M^ED_xM^E$, UV-Cured Film Properties | |
|---|---|---|
| Example Number | x | Peak Tensile, psi | Peak Elongation, % |
| 7 | 50 | 165 | 21 |
| 8 | 100 | 44 | 85 |
| 9 | 400 | - Film could not be cured - | |

*Very fragile films, true tensile probably much higher

It was found that high tensile and elongation properties were not achieved with individual $M^ED_xM^E$ polymers. Improvements in properties obtained by decreasing crosslink density are offset by loss of cure speed and catalyst compatibility which accompany molecular weight build.

Improved tensile and elongation properties were achieved by blending the more reactive, low molecular weight epoxy-stopped dimethylsiloxanes with their higher molecular homologs, as illustrated in Examples 19-54 below.

EXAMPLES 19-25

EXAMPLE 19

Epoxy-functional silicone polymers designated $MD_3^ED_{20}M$ were prepared as follows:

720 grams of trimethyl chain stopped polydimethylmethylhydrogen siloxane copolymer with a viscosity of 25 centipoise and 120 grams of dimethylvinyl chain-stopped linear polydimethyl siloxane with a viscosity of 300 centipoise were mixed with 1.0 grams of platinum catalyst in a 2 liter flask. The mixture had a viscosity=25 cstk. The temperature of this mixture was raised to 50° C. and held for 2 hours, raising the viscosity to 60 cstk. Then 160 grams of 4-vinylcyclohexene oxide (VCHO) were added slowly to the above mixture while maintaining reaction temperature in the 50° C. to 70° C. range. Minimum addition time is two hours. After adding all the VCHO, the batch temperature was brought to 60° C. An analysis was then made for ppm hydrogen. When ppm is less than 40, it is necessary to strip batch at 160° C.±5° C. under vacuum to remove volatiles.

EXAMPLES 20-26

Various blends of two of the silicone polymers prepared in Examples 8, 9, and 19 above were prepared as indicated in Table 4 below. The properties of these blends are also presented in Table 4.

TABLE 4

| 2. Binary Blends of M(E)DxM(E) and $M^ED_3^ED_{20}M$ | | | | | | | |
|---|---|---|---|---|---|---|---|
| M(E)DxM(E) | | | | | | | |
| x = 20 (wt %) | x = 50 (wt %) | x = 100 (wt %) | x = 400 (wt %) | $M^ED_3^ED_{20}M$ (wt %) | Hardness Shore "A" | Tensile (psi) | Elongation (%) |
| 10 | 0 | 90 | 0 | 0 | 19 | 21 | 22 |
| 20 | 0 | 80 | 0 | 0 | 23 | 39 | 37 |
| 0 | 2 | 98 | 0 | 0 | 7 | 30 | 85 |
| 0 | 10 | 90 | 0 | 0 | 7 | 27 | 78 |
| 0 | 20 | 80 | 0 | 0 | 3.2 | 22 | 97 |
| 0 | 0 | 90 | 10 | 0 | 4.5 | 23 | 109 |
| 0 | 0 | 0 | 30 | 70 | 24 | too brittle to measure | |

EXAMPLES 27-52

Ternary blends of the polymers prepared in Examples 8, 9, and 19 were arranged in Examples 27-52, as indicated in Table 5 below. The properties of these blends are summarized in Table 5.

TABLE 5

| Ternary Blends of M(E)DxM(E) Fluids and $M^ED_3^ED_{20}M$ | | | | | | | |
|---|---|---|---|---|---|---|---|
| M(E)DxM(E) | | | | | | | |
| x = 20 (wt %) | x = 50 (wt %) | x = 100 (wt %) | x = 400 (wt %) | $M^ED_3^ED_{20}M$ (wt %) | Hardness Shore "A" | Tensile (psi) | Elongation (%) |
| 0 | 0 | 80 | 10 | 10 | 8.4 | 52 | 127 |
| 0 | 0 | 70 | 10 | 20 | 12.4 | 75 | 102 |
| 0 | 0 | 60 | 10 | 30 | 16.4 | 89 | 80 |
| 0 | 0 | 50 | 10 | 40 | 20.3 | 95 | 60 |
| 0 | 0 | 40 | 10 | 50 | 24.3 | 93 | 43 |
| 0 | 0 | 30 | 10 | 60 | 28.2 | 83 | 29 |
| 0 | 0 | 20 | 10 | 70 | 32.2 | 66 | 17 |
| 0 | 0 | 10 | 10 | 80 | 36.2 | 40 | 7 |
| 0 | 0 | 70 | 20 | 10 | 7.3 | 45 | 140 |
| 0 | 0 | 60 | 20 | 20 | 11.3 | 64 | 112 |
| 0 | 0 | 50 | 20 | 30 | 15.2 | 74 | 87 |
| 0 | 0 | 40 | 20 | 40 | 19.2 | 76 | 65 |
| 0 | 0 | 30 | 20 | 50 | 23.1 | 71 | 45 |
| 0 | 0 | 20 | 20 | 60 | 27.1 | 57 | 28 |
| 0 | 0 | 10 | 20 | 70 | 31.1 | 36 | 13 |
| 0 | 0 | 60 | 30 | 10 | 6.1 | 38 | 145 |
| 0 | 0 | 50 | 30 | 20 | 10.1 | 53 | 114 |
| 0 | 0 | 40 | 30 | 30 | 14.1 | 60 | 86 |
| 0 | 0 | 30 | 30 | 40 | 18.0 | 58 | 61 |
| 0 | 0 | 20 | 30 | 50 | 22.0 | 49 | 38 |
| 0 | 0 | 10 | 30 | 60 | 25.9 | 31 | 18 |
| 0 | 0 | 50 | 40 | 10 | 5.0 | 32 | 141 |
| 0 | 0 | 40 | 40 | 20 | 9.0 | 43 | 108 |
| 0 | 0 | 30 | 40 | 30 | 12.9 | 46 | 77 |
| 0 | 0 | 20 | 40 | 40 | 16.9 | 40 | 49 |
| 0 | 0 | 10 | 40 | 50 | 20.8 | 27 | 24 |

Incorporating higher levels of $M^ED_{100}M^E$ and $M^ED_{400}M^E$ into the blends yielded materials with higher elongation properties. Tensile properties also increased as the weight percent $M^ED_{100}M^E$ in the blends increased. However, increasing the weight percent $M^ED_{400}M^E$ in the blends caused tensile properties to decrease.

What is claimed is:

1. An ultraviolet radiation-curable composition having a tensile strength in the range of from about 45 to about 89 pounds per square inch and an elongation in the range of from about 80% to about 140%, comprising:

(A) a blend of epoxy-functional dialkylpolysiloxanes comprising by weight:
(a) about 5 to about 25 weight % of an epoxy-functional, dialkylpolysiloxane having the general formula

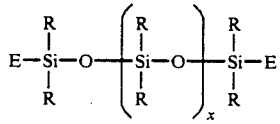

wherein x is a value in the range of about 200 to about 550;

(b) about 10 to about 30 weight % of an epoxy-functional dialkylpolysiloxane having the general formula

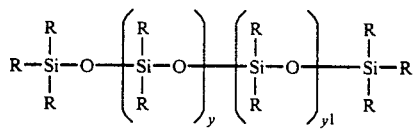

or the general formula:

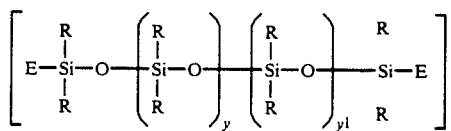

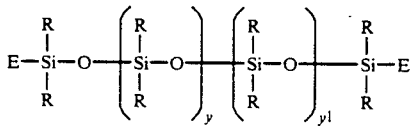

or a mixture of the foregoing, wherein y is a value in the range of about 3 to about 5, and $y^1$ is a value in the range of about 20 to about 100; and (c) about 45 to about 85 weight % of an epoxy-functional dialkylpolysiloxane having the general formula

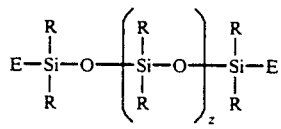

wherein z is a value in the range of 75 to about 150;

wherein E represents an epoxy-functional organic radical having from 2 to 20 carbon atoms and R is individually a lower alkyl radical having 1 to 8 carbon atoms, and (B) a catalytic amount of an onium salt photoinitiator or a combination of onium salt photoinitiators.

2. The composition of claim 1 wherein Component A comprises about 5 to about 25 weight % of the epoxy-functional diorganopolysiloxane of part (a); about 15 to about 25 weight % of the epoxy-functional diorganopolysiloxane of part (b); and about 55 to about 80 weight % of the epoxy-functional diorganopolysiloxane of part (c).

3. The composition of claim 2 wherein Component A comprises about 10 to about 20 weight % of the epoxy-functional diorganopolysiloxane of part (a); about 15 to about 20 weight % of the epoxy-functional diorganopolysiloxane of part (b); and about 60 to about 80 weight % of the epoxy-functional diorganopolysiloxane of part (c).

4. The composition of claim 1 wherein x is about 250 to about 510; y is about 3 to about 4; $y^1$ is about 20 to about 50; and z is about 80 to about 120.

5. The composition of claim 4 wherein x is about 350 to about 510; y is about 3; $y^1$ is about 20 to about 30; and z is about 90 to about 110.

6. The composition of claim 1 wherein R is a methyl group.

7. The composition of claim 1 wherein E is derived from 4-vinylcyclohexeneoxide and has the formula:

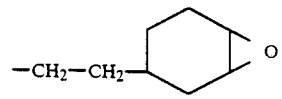

8. The composition of claim 1 wherein component (B) is present in an amount in the range of about 0.5% to about 3% by weight.

9. The composition of claim 1 wherein component (B) is a diaryliodonium salt.

10. The composition of claim 9 wherein component (B) has the formula

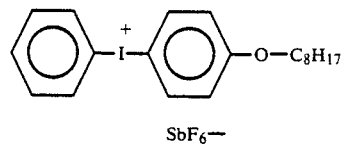

11. The composition of claim 9 wherein component (B) is bis(dodecyl phenyl) iodonium hexafluoroantimonate.

12. An article of manufacture, comprising a substrate having disposed on the surface thereof a coating comprising the cured composition of claim 1.

13. The article of claim 12 wherein the substrate is a circuit board.

14. A method for making a UV-curable composition having a tensile strength in the range of from about 45 to about 89 pounds per square inch and an elongation in the range of 80% to about 140%, comprising mixing
(A) a blend of epoxy-functional dialkylpolysiloxanes comprising by weight:
(a) about 5 to about 25 weight % of an epoxy-functional dialkylpolysiloxane having the general formula

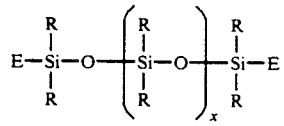

wherein x is a value in the range of about 200 to about 550;

(b) about 10 to about 30 weight % of an epoxy-functional dialkylpolysiloxane having the general formula

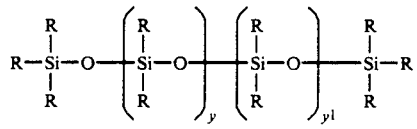

or the general formula:

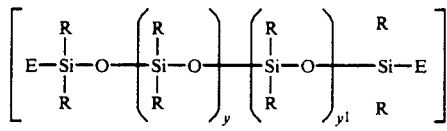

-continued

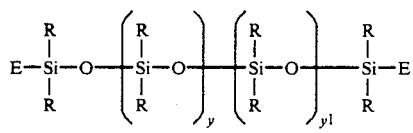

or a mixture of the foregoing, wherein y is a value in the range of about 3 to about 5, and $y^1$ is a value in the range of about 20 to about 100; and (c) about 45 to about 85 weight % of an epoxy-functional dialkylpolysiloxane having the general formula

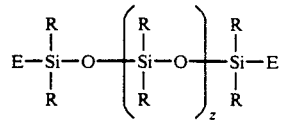

wherein z is a value in the range of 75 to about 150;

wherein E represents an epoxy-functional organic radical having from 2 to 20 carbon atoms and R is individually a lower alkyl radical having 1 to 8 carbon atoms, and (B) a catalytic amount of an onium salt photoinitiator or a combination of onium salt photoinitiators.

* * * * *